United States Patent
Vimercati

(10) Patent No.: US 10,679,689 B2
(45) Date of Patent: Jun. 9, 2020

(54) OFFSET CANCELLATION FOR LATCHING IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/184,823

(22) Filed: Nov. 8, 2018

(65) Prior Publication Data

US 2019/0147933 A1 May 16, 2019

Related U.S. Application Data

(63) Continuation of application No. 15/655,644, filed on Jul. 20, 2017, now Pat. No. 10,163,481.

(51) Int. Cl.
*G11C 11/22* (2006.01)

(52) U.S. Cl.
CPC ........ *G11C 11/2273* (2013.01); *G11C 11/221* (2013.01); *G11C 11/2253* (2013.01); *G11C 11/2297* (2013.01)

(58) Field of Classification Search
CPC .............. G11C 11/221; G11C 11/2273; G11C 11/2275; G11C 11/2259; G11C 11/2253; G11C 11/2297; G11C 11/2293; G11C 11/4091; G11C 7/14; G11C 11/22; G11C 11/2255; G11C 11/2257

USPC .............. 365/185.21, 185.17, 185.2, 185.05, 365/185.18, 185.22, 185.25, 211, 212
See application file for complete search history.

(56) References Cited

U.S. PATENT DOCUMENTS

| | | | |
|---|---|---|---|
| 8,598,912 B2 | 12/2013 | Thompson et al. | |
| 9,190,126 B2 | 11/2015 | Thompson et al. | |
| 9,858,978 B2 | 1/2018 | Vimercati | |
| 9,858,979 B1* | 1/2018 | Derner | G11C 11/2275 |
| 9,911,501 B2 | 3/2018 | Tran et al. | |
| 2002/0003734 A1 | 1/2002 | Kim et al. | |
| 2003/0173998 A1 | 9/2003 | Terzioglu et al. | |
| 2006/0142988 A1 | 6/2006 | Akiyama et al. | |

(Continued)

OTHER PUBLICATIONS

ISA/KR, International Search Report and Written Opinion of the International Searching Authority, Int'l Appl. No. PCT/US2018/042584, dated Jan. 2, 2019, Korean Intellectual Property Office, Seo-gu, Daejeon, Republic of Korea, 13 pgs.

*Primary Examiner* — Thong Q Le
(74) *Attorney, Agent, or Firm* — Holland & Hart LLP

(57) ABSTRACT

Methods, systems, and devices for offset cancellation for latching in memory devices are described. A memory device may include a sense component comprising a first and second transistor. In some cases, a memory device may further include a first capacitor coupled to the first transistor and a second capacitor coupled to the second transistor and a first switching component coupled between a voltage source and the first capacitor and the second capacitor. For example, the first switching component may be activated, a reference voltage may be applied to the sense component, and the first switching component may then be deactivated. In some examples, a voltage offset may be measured across both the first and the second capacitor.

20 Claims, 10 Drawing Sheets

(56) References Cited

U.S. PATENT DOCUMENTS

2010/0067318  A1    3/2010   Senou
2015/0022264  A1    1/2015   Kim et al.

* cited by examiner

OFFSET CANCELLATION FOR LATCHING IN A MEMORY DEVICE

CROSS REFERENCE

The present Application for Patent is a continuation of U.S. patent application Ser. No. 15/655,644, by Vimercati, entitled "Offset Cancellation for Latching in A Memory Device," filed Jul. 20, 2017, assigned to the assignee hereof, which is expressly incorporated by reference in its entirety herein.

BACKGROUND

The following relates generally to operating a memory array and more specifically to offset cancellation for latching in memory device.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. In some memory devices, there may be a voltage disparity between the input nodes to the sense component of the memory cell. This voltage disparity may result in a voltage offset between capacitors coupled the sense component. In some cases, the voltage disparity may result in current leakage from the capacitors and a loss of stored information. In some examples, the voltage offset may also reduce the signal produced during an access operation in the memory cell.

DETAILED DESCRIPTION

Figure 1:
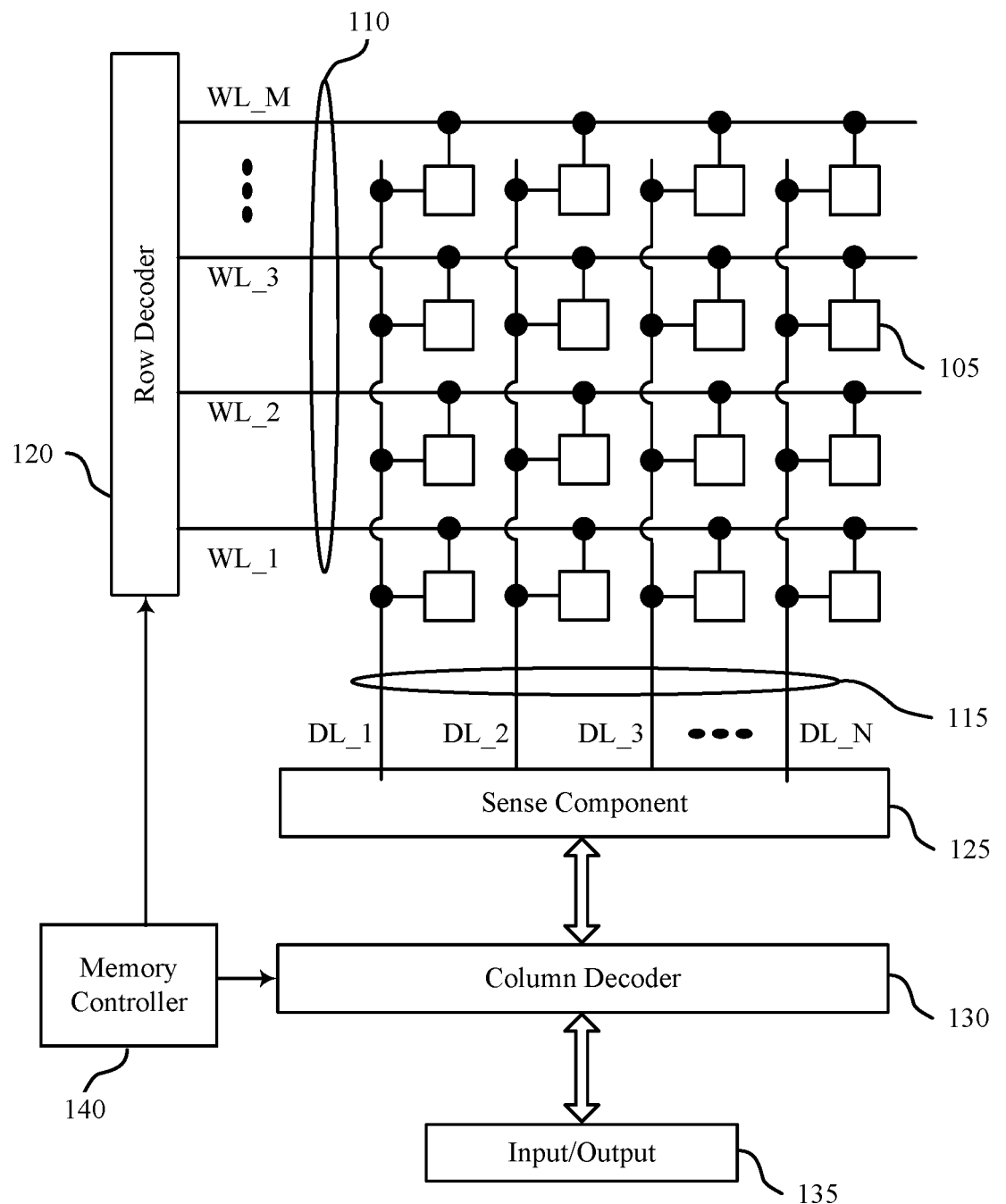
FIG. 1 illustrates an example of a memory array that supports offset cancellation in a memory device in accordance with embodiments of the present disclosure.

In some cases, there may be a difference in the voltage between the input nodes of a sense component. Therefore, the difference in voltage across the sense component may not be isolated from the transistors of the sense component. That is, the gate voltage of the first and second transistor within the sense component may drain different currents from a memory cell. In some cases, a first and second capacitor may be in implemented between the input nodes of the sense component. Even if the voltage of the first and second transistors within the sense component match, a voltage may be generated across the first and second capacitors due to a voltage disparity between external transistors coupled to the sense component. For example, the difference in voltage between the input nodes of the sense component may be unrelated to the voltage disparity of the first and second transistors of the sense component and related to the voltage disparity between external transistors coupled to the sense component.

An offset cancellation technique may be used to reduce the impact of the voltage offset (e.g., voltage disparity) on the sense component and for enabling more accurate access operations. In some cases, offset cancellation may be performed in parallel to signal development without impacting the performance of the memory device. To reduce the voltage offset, a first and second capacitor may be coupled to the first transistor and the second transistor of the sense component, respectively. In addition, a switching component may be implemented between the first and second capacitor to connect the first and second capacitors to a voltage source. For example, the voltage offset may be reduced by coupling the switching component between the first and second capacitor to supply a voltage to the sense component, which in some cases, reduces the voltage offset.

In some cases, the voltage across the first and second capacitor may be proportional to the voltage difference between both the first and second transistor of the sense component. As a result, the voltage across both the first and second capacitors may not be impacted by the disparity voltage of the switching components, which may enable more accurate access operations.

The offset cancellation technique may be applied to reduce the voltage offset between the two transistors within the sense component. Offset cancellation techniques may be effective if the total area of the memory device and the consumption is lower than increasing the area of the memory device that causes the voltage disparity. In some cases, FeRAM devices that may use alternative offset cancellation techniques may not achieve the same results or efficacy as DRAM devices due to the use of high voltage devices.

Features of the disclosure introduced above are further described below in the context of FIG. 1. Specific examples are then described for FIGS. 2-7. These and other features of the disclosure are further illustrated by and described with reference to apparatus diagrams, system diagrams, and flowcharts that relate to offset cancellation for latching in memory device.

FIG. 1 illustrates an example memory array 100 that supports offset cancellation in a memory device in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some examples, a logic state may be read from memory cell 105 in electronic communication with one or more other components. In some examples, a logic state may be read from a memory cell in electronic communication with a first capacitor and a second capacitor (not shown in FIG. 1) based on measuring a voltage offset across both the first and second capacitor.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. In some examples, sense component 125 may be coupled to a first capacitor and a second capacitor.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
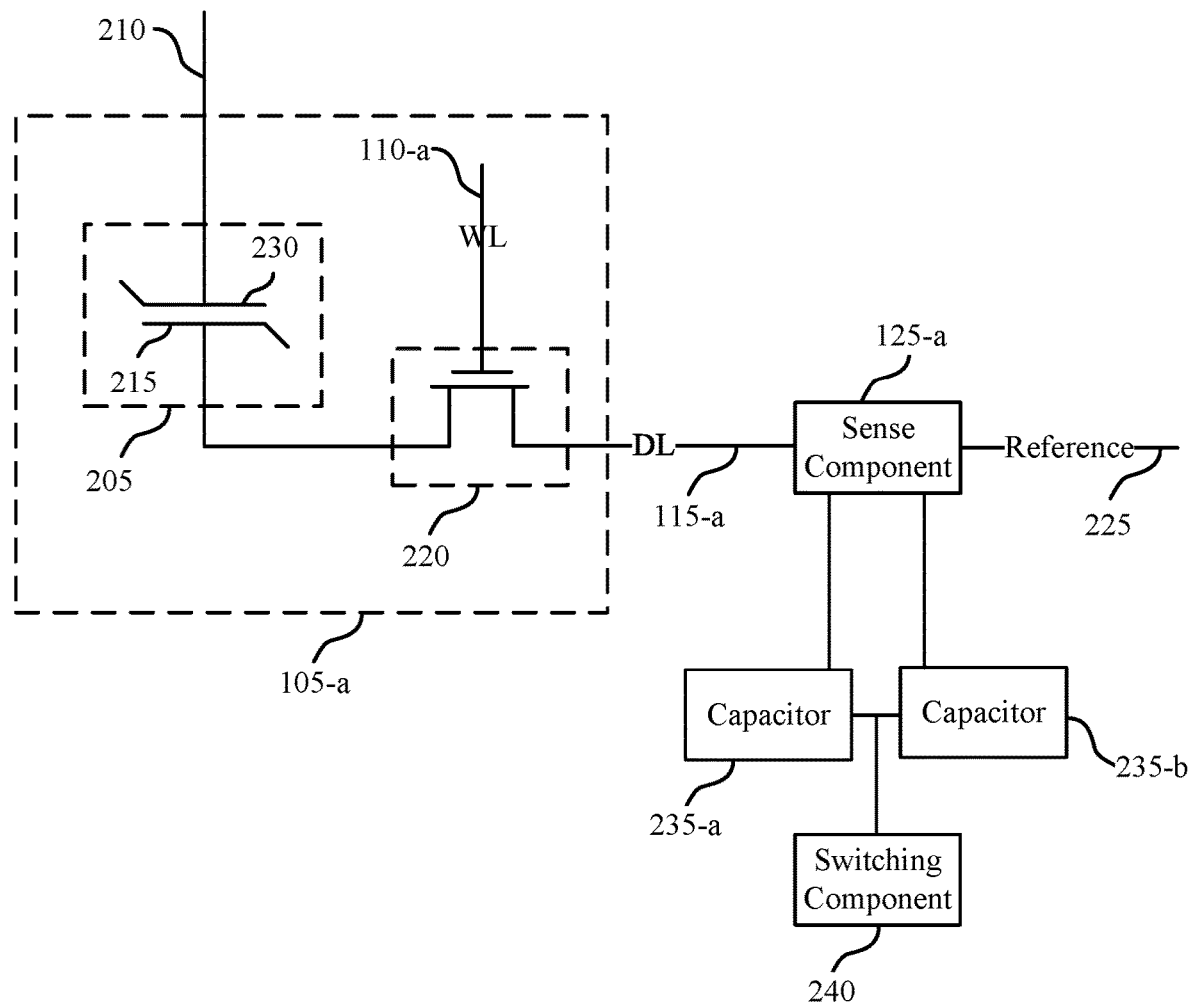
FIG. 2 illustrates an example circuit that supports offset cancellation in a memory device in accordance with embodiments of the present disclosure.

FIG. 2 illustrates an example circuit 200 that supports offset cancellation in a memory device in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

Circuit 200 may also include capacitors 235-*a*, capacitor 235-*b* and switching component 240. In some cases, sense component 125-*a* may be coupled to capacitor 235-*a* and capacitor 235-*b*. Capacitor 235-*a* and capacitor 235-*b* may be coupled to switching component 240. In some cases, the switching component 240 may be or include a nMOS transistor. For example, switching component 240 may supply a voltage to sense component 125-*a* and capacitor 235-*a* and 235-*b* may be positioned between switching component 240 and sense component 125-*a*. As described herein, the charge stored in capacitor 235-*a* and 235-*b* may be dependent on the threshold voltage across sense component 125-*a*. In some cases, the voltage across both capacitor 235-*a* and 235-*b* may be proportional to the voltage difference across sense component 125-*a*. In some cases, a voltage offset may be determined across both capacitor 235-*a* and 235-*b*. For example, a voltage offset may be measured across both capacitor 235-*a* and 235-*b*. In some examples, the voltage offset may be reduced by coupling capacitor 235-*a*, capacitor 235-*b*, and switching component 240 to sense component 125-*a*. For example, the voltage offset may be reduced by coupling switching component 240 between capacitor 235-*a* and 235-*b* to supply a voltage to sense component 125-*a*, which in some cases reduces the voltage offset and enables more accurate access operations.

Figure 3:
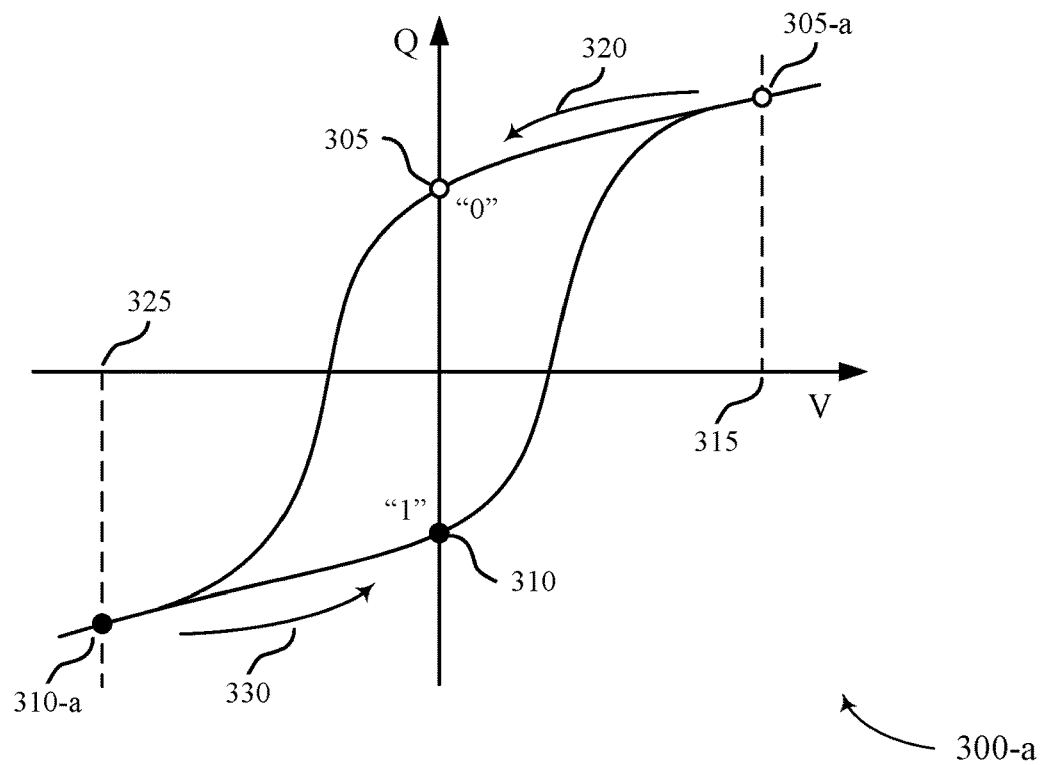
FIG. 3 illustrates an example of a of non-linear electrical properties with hysteresis curves for a ferroelectric memory cell that supports offset cancellation in a memory device in accordance with embodiments of the present disclosure.
Figure 3:
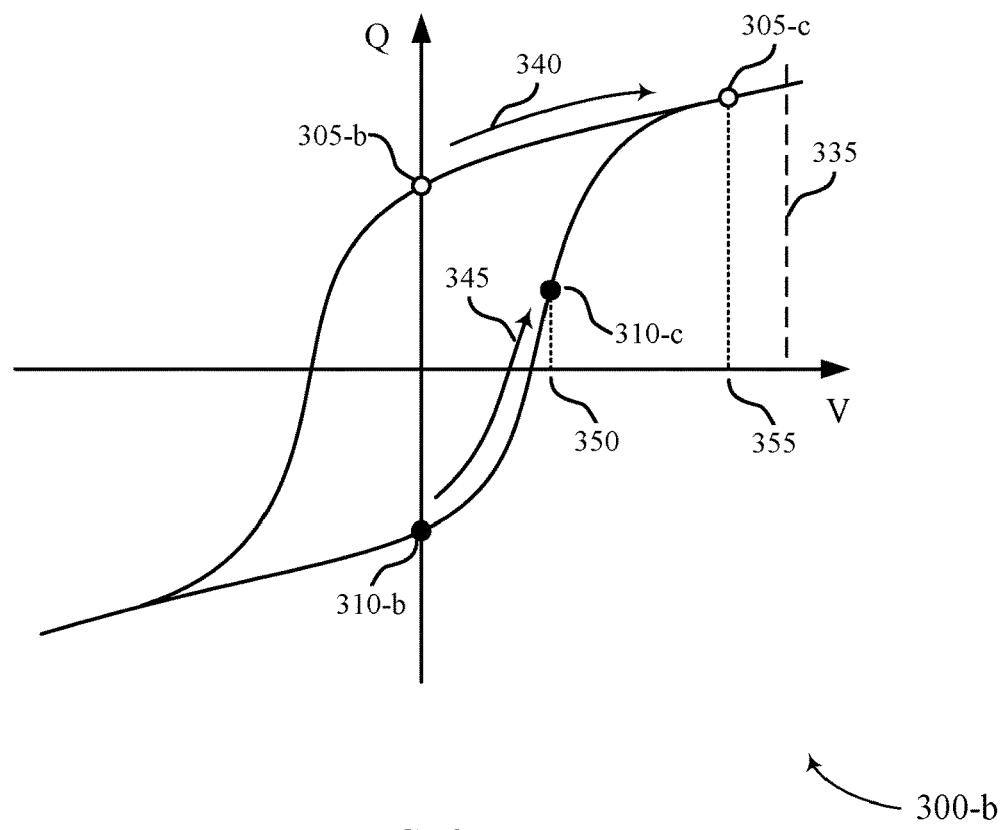

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO3$), lead titanate ($PbTiO3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-*a* and 300-*b* represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335−voltage 350) or (voltage 335−voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335−voltage 350) and (voltage 335−voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
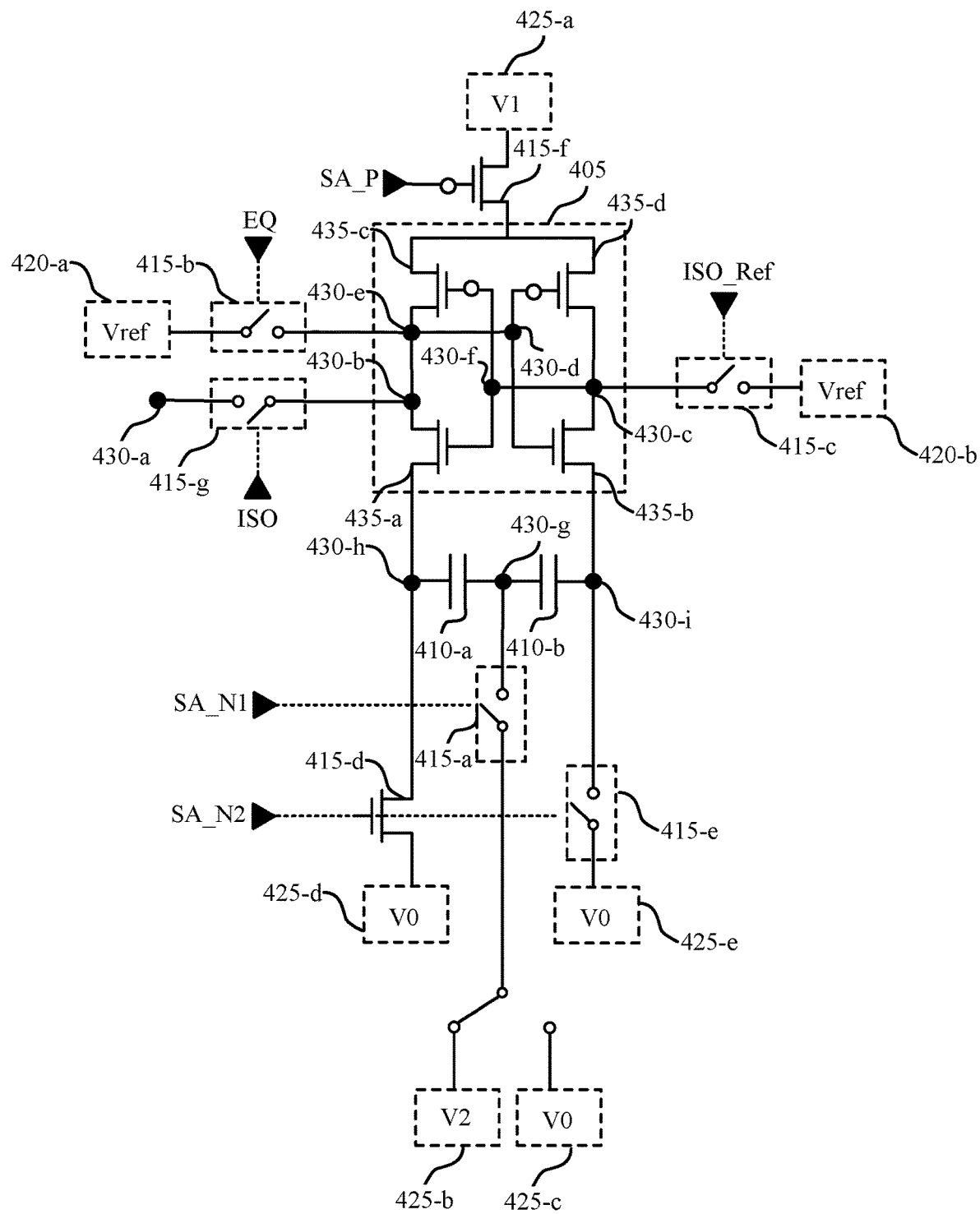
FIG. 4 illustrates an example circuit that supports offset cancellation in a memory device in accordance with embodiments of the present disclosure.

FIG. 4 shows an example circuit 400 that supports offset cancellation in a memory device in accordance with various embodiments of the present disclosure. In some examples, circuit 400 may be a part of a memory array that generates an offset voltage. In some cases, circuit 400 may be part of, or an example of circuit 200 with reference to FIG. 2. Circuit 400 may include a number of components, that states of which (e.g., whether they are activated or deactivated) are described herein. The states of the components shown in circuit 400 may be sensed using one or more sensing operations that occur before writing or reading circuit 400.

The circuit 400 may include sense component 405, capacitors 410-a and 410-b, switching components 415-a through 415-g, reference voltage components 420-a and 420-b, and voltage sources 425-a through 425-e. Sense component 405 may be an example of embodiments of a sense component 125 as described with reference to FIG. 1. Capacitors 410 and switching components 415 may be an example of embodiments of capacitor 235 and switching component 240 as described in reference to FIG. 2

The circuit 400 may include sense component 405. Sense component 405 may represent a sense component 405 in electronic communication with a ferroelectric memory array via node 430-a and voltage source 425-a (e.g., a first voltage source). The sense component 405 may include transistor 435-a (e.g., a first transistor), transistor 435-b (e.g., a second transistor), transistor 435-c, and transistor 435-d. In some examples, transistors 435-a and 435-b may be examples of nMOS transistors. In some examples, transistor 435-c and transistor 435-d may be examples of pMOS transistors. Sense component 405 may, in some examples, include a cross-coupled nMOS transistor and pMOS transistor pair connected via nodes 430-c through 430-f.

The circuit 400 may include a number of switching components 415-a through 415-g. In some cases, switching components 415 may be an example of or may include a transistor. In some examples, switching components 415 may be an example of or may include a switch. Although described with reference to transistors or switches, the techniques described herein may be implemented using other types of components. Additionally, the type of transistor used can vary. Each switching component may be activated (e.g., turned on) by controlling the voltage applied at the gate of the switching component. For example, a switching component 415-a (e.g., first switching component) may be activated by applying a signal to the gate of the switching component 415-a and then passing a voltage (which may in some cases be a positive voltage) supplied by voltage source 425-b (e.g., a second voltage source) through the switching component 415-a and a switching component 415-b (e.g., a second switching component) may be activated by applying a signal to the gate of the switching component 415-b and then passing a voltage (which may in some cases be a reference voltage) supplied by the reference voltage component 420-a (e.g., a first reference voltage component) through the switching component 415-b. The voltage supplied by the voltages sources may satisfy the threshold voltage requirements to turn on the respective switching component. In some cases, a controller may coordinate the application of voltages to the switching components in circuit 400.

Switching component 415 may represent switching component 415-a coupled between voltage source 425-b and capacitor 410-a (e.g., a first capacitor) and capacitor 410-b (e.g., a second capacitor) via node 430-g (e.g., a third node). In some cases, switching component 415-a may be or include a nMOS transistor. In some cases, switching component 415-c (e.g., a third switching component) may be coupled to a reference voltage component 420-b (e.g., a second reference voltage component). In some cases, switching component 415-c may be or include an isolation reference device component. Switching component 415-d (e.g., a fourth switching component) may be coupled to capacitor 410-a via node 430-h (e.g., a first node). In some cases, switching component 415-d may be or include a nMOS transistor. Switching component 415-e (e.g., a fifth switching component) may be coupled to the capacitor 410-b via node 430-i (e.g., a second node). In some cases, switching component 415-e may be or include a nMOS transistor. Switching component 415-f (e.g., a sixth switching component) may be coupled to transistor 435-a and transistor 435-b. In some cases, switching component 415-f may be or include a pMOS transistor.

In some cases, one or more voltage sources may be used to control the voltage applied at the gates of the switching components (e.g., the gate of each switching component may be connected, for instance via a wired connection, to a voltage supply). When activated, a switching component may enable the flow of current between two components; when deactivated, the switching component may prevent the flow of current between the two components. Voltage source 425-*a* may supply a voltage of positive voltage (e.g., 1.6 V) to switching component 415-*f*. In some examples, voltage source 425-*b* may supply a positive voltage (e.g., 1.2 V) to switching component 415-*a* or voltage source 425-*c* may supply a ground voltage (e.g., 0 V) to switching component 415-*a*. Voltage source 425-*d* and 425-*e* may supply a ground voltage to switching components 415-*d* and 415-*e*, respectively. In some cases, reference voltage components 420-*a* and 420-*b* may supply a reference voltage to switching component 415-*b* and 415-*c*, respectively. Node 430-*a* may apply a signal from the memory array to the switching component 415-*g*. The voltages applied to the gates of the switching components of circuit 400 may be controlled by a controller and may be supplied by the same or different voltage sources. The source of each switching component may be connected to (e.g., in electronic communication with or hard-wired to) a positive voltage source (e.g., voltage source 425-*b*) or virtual ground reference source (e.g., voltage source 425-*c*).

Reference voltage component 420-*a* may be coupled to transistor 435-*a* of the sense component 405 via node 430-*e*. In some cases, reference voltage component 420-*a* may include a switching component 415-*b*. The switching component 415-*b* may be an example of an equalization device component. Reference voltage component 420-*b* may be coupled to transistor 435-*b* of the sense component 405 via 430-*c*. The reference voltage component 420-*b* may include a switching component 415-*c*. The switching component 415-*c* may be an example of an isolation reference device component.

Circuit 400 may also include capacitors 410-*a* and 410-*b* (e.g., dielectric capacitors, ferroelectric capacitors) that are in electronic communication with the sense component 405. Although described with reference to discrete capacitors, in some cases the charge from memory cells may be stored at nodes 430-*h* and 430-*i* (e.g., a first node and a second node) using the intrinsic capacitance of the conductive line between transistor 435-*a* and transistor 435-*b*. In some examples, the charge may be stored at node 430-*g* using the intrinsic capacitance of the conductive line between the first switching component and the sense component 405.

Capacitor 410-*a* may be coupled to transistor 435-*a* via node 430-*h*. In some examples, a voltage may be determined at node 430-*h* that may be dependent on a threshold voltage of transistor 435-*a*. For example, a voltage may be measured at node 430-*h*. Capacitor 410-*b* may be coupled to transistor 435-*b* via node 430-*i*. In some examples, a voltage may be determined at node 430-*i* that may be dependent on a threshold voltage of transistor 435-*b*. For example, a voltage may be measured at node 430-*i*. In some cases, capacitor 410-*a* may be positioned between node 430-*h* and node 430-*g* and capacitor 410-*b* may be positioned between node 430-*i* and node 430-*g*.

As described herein, circuit 400 may undergo a pre-charge operation. During the pre-charge operation, the voltages at nodes 430-*h* and 430-*i* may be reduced to zero by activating and deactivating certain components. For example, node 430-*h* may be pre-charged to 0 V by activating switching component 415-*a* and activating switching component 415-*d* to connect node 430-*h* to ground. For example, switching component 415-*a* may be coupled to voltage source 425-*c* to supply a ground voltage (e.g., 0V). In some examples, node 430-*i* may also be pre-charged to 0V by activating switching component 415-*a* and activating switching component 415-*e* to connect node 430-*i* to ground. For example, switching component 415-*e* may be coupled to voltage source 425-*e* to supply a ground voltage (e.g., 0V). Similarly, node 430-*g* may be pre-charged to 1.2 V by activating switching component 415-*a* to voltage source 425-*b*. In some cases, node 430-*a* and voltages source 425-*a* may each be isolated from sense component 405 by deactivating switching component 415-*g* and switching component 415-*f*, respectively. The pre-charge operation depicted in circuit 400 may facilitate the generation of a voltage that can be used to adjust an offset voltage.

As described herein, circuit 400 may undergo a sensing operation. During the sensing operation, node 430-*h* and node 430-*i* may be charged to a reference voltage (e.g., 2.3 V) by activating switching components 415-*b* and 415-*c*. That is, the voltage of node 430-*h* and node 430-*i* may increase to a voltage between the pre-charge voltage (e.g., 0 V) and the reference voltage (e.g., 2.3 V) based on deactivating switching component 415-*a*. In some cases, node 430-*g* may be charged to a positive voltage (e.g., 1.2 V) by activating switching component 415-*a* coupled to voltage source 425-*b*.

In some cases, the voltage of node 430-*h* may be dependent on the threshold voltage of the transistor 435-*a*. Similarly, the voltage of node 430-*i* may dependent on the threshold voltage of the transistor 435-*b*. That is, the charge stored in capacitor 410-*a* may be dependent on the threshold voltage of transistor 435-*a* of sense component 405. In some examples, the charge stored in capacitor 410-*b* may be dependent on the threshold voltage of transistor 435-*b* of sense component 405. In some cases, the voltage across both capacitor 410-*a* and 410-*b* may be proportional to the voltage difference between both the transistor 435-*a* and 435-*b* of sense component 405. As a result, the voltage across both capacitor 410-*a* and 410-*b* may not be impacted by the disparity voltage of switching components 415-*a*, 415-*d*, and 415-*e*, which may enable more accurate access operations. In some cases, there may be a voltage disparity between transistor 435-*a* and transistor 435-*b* of sense component 405. To reduce the voltage disparity between transistor 435-*a* and transistor 435-*b*, capacitor 410-*a* and capacitor 410-*b* may be coupled to the sense component 405.

As described herein, circuit 400 may, in some examples, undergo an amplification operation to build a signal on the sense component 405. During the amplification operation, switching components 415-*g* and 415-*c* may be activated to supply a signal from the memory array and a reference voltage from reference voltage component 420-*b* to the sense component 405. Node 430-*a* and reference voltage component 420-*b* may then be isolated from the sense component 405 by deactivating switching components 415-*g* and 415-*c*, respectively. In some cases, node 430-*g* may be charged to 0 V by activating switching component 415-*a* connected to voltage source 425-*c*. For example, activating switching component 415-*a* may decrease the voltage of nodes 430-*h*, 430-*i*, and 430-*g* and may allow current to flow through the transistor 435-*a* and the transistor 435-*b*. To complete the amplification process, the switching components 415-*d* and 415-*e* may then be activated. In some cases, switching component 415-*f* may be activated to latch the data in the sense component 405 and store the data in the latch.

Figure 5:
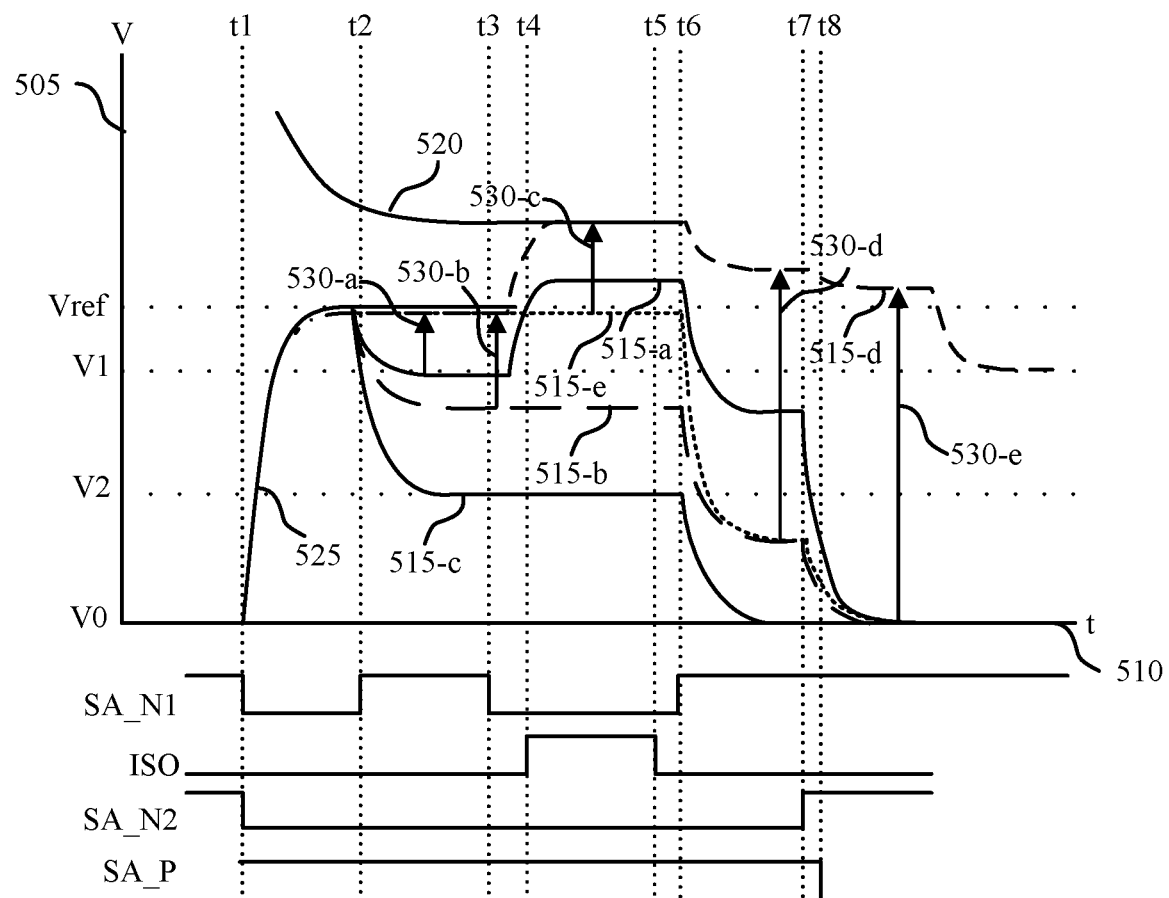
FIG. 5 illustrates an example of a timing diagram that supports offset cancellation in a memory device in accordance with embodiments of the present disclosure.

FIG. 5 illustrates an example of a timing diagram 500 during a sensing operation that supports offset cancellation in memory device in accordance with various embodiments of the present disclosure. Timing diagram 500 includes voltage represented on axis 505 and time represented on axis 510, and timing diagram 500 depicts an exemplary sensing operation of a first logic state (e.g., sensing a "1") of circuit 400.

The voltages applied to various components of circuit 400 are represented as a function of time on timing diagram 500. For example, timing diagram 500 includes voltages Vref, V1, V2, and V0. In some examples, Vref may be 2.3 V, V1 may be 1.6 V, V2 may be 1.2 V, and V0 may be 0 V. The voltages of various nodes of circuit 400 are also represented as a function of time on timing diagram 500. For example, timing diagram includes voltage 515-a that may correspond to the voltage at node 430-h, voltage 515-b that may correspond to the voltage at node 430-i, and voltage 515-c that may correspond to the voltage at node 430-g. Timing diagram 500 may also include voltage 515-d that may correspond to the voltage at node 430-b and voltage 515-e that may correspond to the voltage at node 430-c. Signal voltage 520 may, in some examples, be an example of the voltage of the signal supplied via node 430-a from the memory array. Reference voltage 525 may be an example of the reference voltage applied to the sense component. In some examples, voltages may be shown offset from each other in timing diagram 500 for ease of understanding, but these voltages may otherwise overlap or be the same during at least a length of time. Timing diagram 500 also depicts voltages of various switching components. In some examples, a signal (e.g., SA_N1) may be supplied to the gate of switching component 415-a. In some examples, a signal (e.g., ISO) may be supplied to the gate of switching component 415-g. In some cases, a signal (e.g., SA_N2) may be supplied to the gate of switching components 415-d and 415-e. In some other examples, a signal (e.g., SA_P) may be supplied to the gate of switching component 415-f.

The sensing operation may include activating and deactivating one or more switching components in circuit 400. For example, at time t1, reference voltage 525 may be applied to the sense component and increase when Vref is applied to the sense component. That is, the voltage of nodes 430-b and 430-c may be the reference voltage. At time t2, a conductive path may be established between node 430-g and voltage source 425-b by applying an activating signal SA_N1 to switching component 415-a. Thus, voltages 515-a and 515-b may decrease due to the current flow across transistor 435-a and 435-b of sense component 405, respectively. Similarly, voltage 515-c may decrease to V2 based on the signal SA_N1. The difference between the reference voltage 525 and voltage 515-a may, in some examples, correspond to the threshold voltage of the transistor 435-a (e.g., as depicted by arrow 530-a). Similarly, the difference between reference voltage 525 and voltage 515-b may correspond to the threshold voltage of transistor 435-b (e.g., as depicted by arrow 530-b). In some cases, the respective threshold voltage of transistors 435-a and 435-b may differ due to process variations. Additionally, at time t3, signal SA_N1 may be isolated from node 430-g (i.e., switching component 415-a is deactivated). To amplify the signal through sense component 405, signal voltage 520 may be introduced by supplying signal ISO at time t4 to connect the memory array to the sense component. Thus, voltage 515-d may increase to signal voltage 520.

The amplification operation may, in some examples, include supplying activating signals and deactivating signal SA_N1 and SA_N2. In some cases, a signal SA_N1 may be supplied to switching component 415-a at time t6. That is, V0 may be supplied to node 430-g. Thus, voltage 515-a, 515-b, and 515-c may decrease. To complete amplification of the signal, signal SA_N2 may supply V0 to node 430-h and node 430-i at time t7. Thus, voltage 515-a, 515-b, and 515-c may decrease to V0. In some cases, arrows 530-c, 530-d, and 530-e may correspond to the amplification of the signal across the sense component 405. Therefore, arrows 530-c, 530-d, and 530-e may correspond to the amplification signal when the sense component 405 may include a high signal. In some cases, the voltage disparity between node 430-h and node 430-i may contribute less to the offset voltage because the signal across sense component 405 may be large enough to overcome any voltage disparity.

Figure 6:
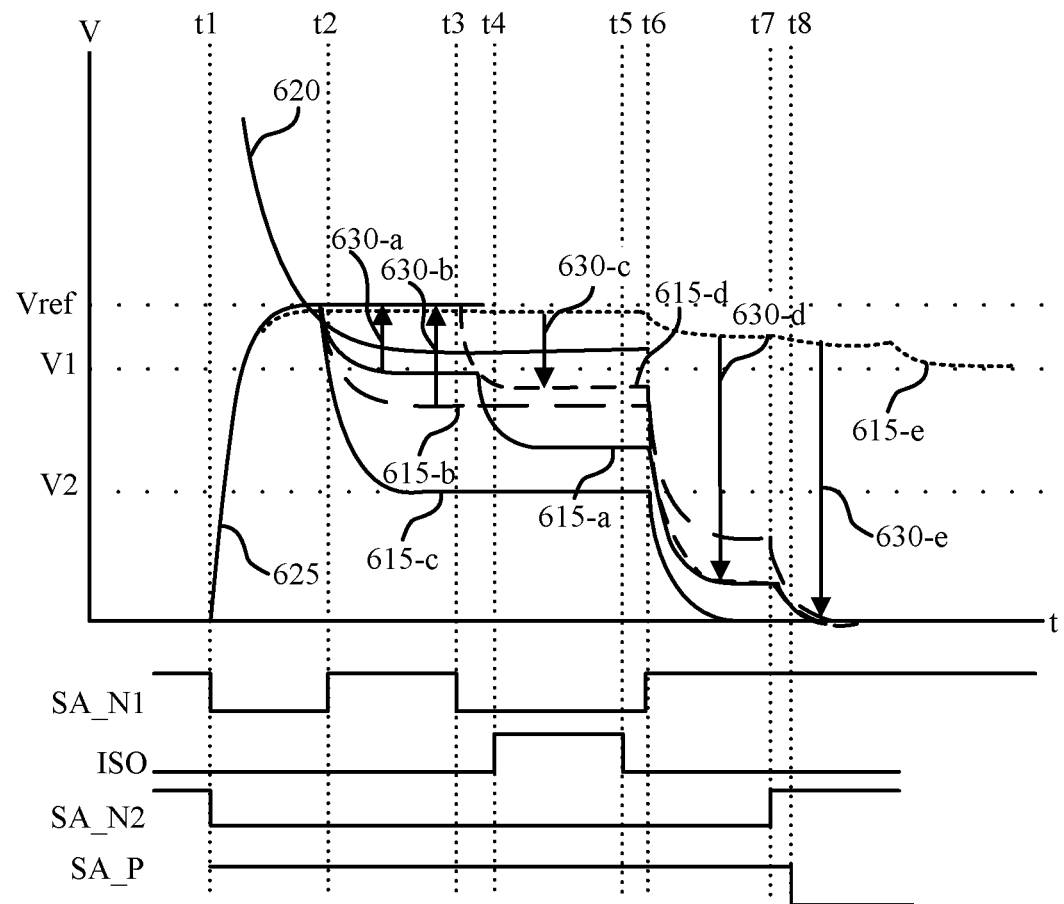
FIG. 6 illustrates an example of a timing diagram that supports offset cancellation in a memory device in accordance with embodiments of the present disclosure.

FIG. 6 illustrates an example of a timing diagram 600 during a sensing operation that supports offset cancellation in a memory device in accordance with various embodiments of the present disclosure. Timing diagram 600 includes voltage represented on axis 605 and time represented on axis 610, and timing diagram 600 depicts an exemplary sensing operation of a second logic state (e.g., sensing a "0") of circuit 400.

The voltages applied to various components of circuit 400 are represented as a function of time on timing diagram 600. For example, timing diagram 600 includes voltages Vref, V1, V2, and V0. Voltages Vref, V1, V2, and V0 may each be an example of embodiments of voltages Vref, V1, V2, and V0 as described in reference to FIG. 5. The voltages of various nodes of circuit 400 are also represented as a function of time on timing diagram 600. For example, timing diagram includes voltage 615-a that may correspond to the voltage at node 430-h, voltage 615-b that may correspond to the voltage at node 430-i, and voltage 615-c that may correspond to the voltage at node 430-g. Timing diagram 600 may also include voltage 615-d that may correspond to the voltage at node 430-b and voltage 615-e that may correspond to the voltage node at 430-c. Signal voltage 620 may, in some examples, be an example of the voltage of the signal supplied via node 430-a from the memory array. Reference voltage 625 may be an example of the reference voltage applied to the sense component. In some examples, voltages may be shown offset from each other in timing diagram 600 for ease of understanding, but these voltages may otherwise overlap or be the same during at least a length of time. Timing diagram 600 also depicts voltages of various switching components. In some examples, a signal (e.g., SA_N1) may be supplied to the gate of switching component 415-a. In some examples, a signal (e.g., ISO) may be supplied to the gate of switching component 415-g. In some cases, a signal (e.g., SA_N2) may be supplied to the gate of switching components 415-d and 415-e. In some other examples, a signal (e.g., SA_P) may be supplied to the gate of switching component 415-f.

The sensing operation may include activating and deactivating one or more switching components in circuit 400. For example, at time t1, reference voltage 625 may increase when Vref is applied to the sense component. That is, the voltage of node 430-b and 430-c may be the reference voltage. Activating signal SA_N1 may be supplied at time t2 to establish a conductive path between node 430-g and voltage source 425-b. Thus, voltage 615-a and 615-b may decrease due to the current flow across transistor 435-a and 435-b of sense component 405, respectively. Similarly, voltage 615-c may decrease to V2 based on signal SA_N1. The difference between the reference voltage 625 and voltage 615-a may, in some examples, correspond to the threshold voltage of the transistor 435-a (e.g., as depicted by arrow 630-a). Similarly, the difference between reference voltage 625 and voltage 615-b may correspond to the threshold voltage of transistor 435-b (e.g., as depicted by arrow 630-b). Additionally, at time t3, switching component 415-a may be deactivated to isolate node 430-g. To amplify the signal through the sense component 405, signal voltage 620 may be supplied by signal ISO at time t4 to connect the signal from the memory array to the sense component. Thus, voltage 615-d may decrease to signal voltage 620.

The amplification operation may, in some examples, include activating and deactivating one or more switching components (e.g., switching components 415-a, 415-d, and 415-e in circuit 400). In some cases, at time t6, activating signal SA_N1 may be supplied. to switching component 415-a That is, a voltage V0 may be supplied to node 430-g. Thus, voltage 615-a, 615-b, and 615-c may decrease. To complete the amplification of the signal, activating signal SA_N2 may be supplied at time t7 to supply V0 to node 430-h and node 430-i. Thus, voltage 615-a, 615-b, and 615-c may decrease to V0. In some cases, arrows 630-c, 630-d, and 630-e may correspond to the deamplification of the signal across the sense component 405.

In some cases, input offset with two capacitor offset compensation, in line with the present disclosure and techniques, may result in a voltage disparity reduction more than ten times the voltage disparity of an input offset with one capacitor or no input offset. For example, the voltage disparity between the first transistor and the second transistor of the sense component may be reduced by coupling the first capacitor and the second capacitor to the sense component. That is, the voltage disparity reduction may be equivalent to 100x area increase for the sense component. For example, a voltage applied to the sense component to read a "0" may be the voltage difference between the voltage supplied by the reference voltage component and the voltage supplied to the memory array. The voltage applied may result in every sense components correctly reading a "0". In some cases, when the same voltage may be applied to the sense component without offset compensation, fewer than half of the sense components may correctly read a "0" and more than half of the sense components may incorrectly read a "0)" (e.g., more than half of the sense components read a "1"). That is, input offset with two capacitor offset compensation may reduce the voltage disparity and may reduce the number of sense components that may inaccurately read the logic state of the memory cell.

Figure 7:
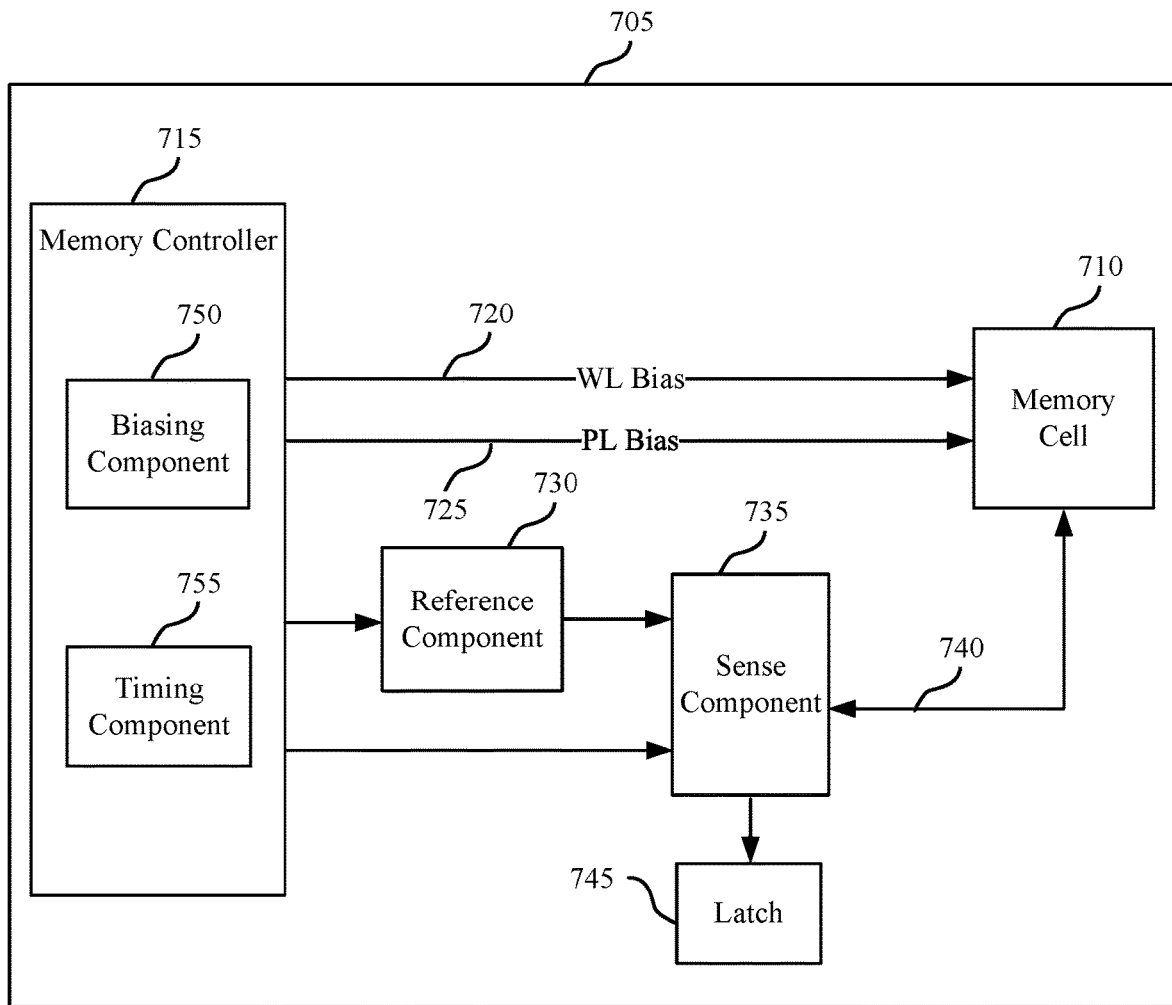
FIG. 7-8 shows block diagrams of a device that supports offset cancellation in a memory device in accordance with embodiments of the present disclosure.

FIG. 7 shows a block diagram 700 of a memory array 705 that supports offset cancellation in a memory device in accordance with embodiments of the present disclosure. Memory array 705 may be referred to as an electronic memory apparatus, and may be an example of a component of a memory array 100 as described with reference to FIG. 1.

Memory array 705 may include one or more memory cells 710, a memory controller 715, a word line 720, a plate line 725, a reference component 730, a sense component 735, a digit line 740, and a latch 745. These components may be in electronic communication with each other and may perform one or more of the functions described herein. In some cases, memory controller 715 may include biasing component 750 and timing component 755.

Memory controller 715 may be in electronic communication with word line 720, digit line 740, sense component 735, and plate line 725, which may be examples of word line 110, digit line 115, sense component 125, and plate line 210 described with reference to FIGS. 1, and 2. Memory array 705 may also include reference component 730 and latch 745. The components of memory array 705 may be in electronic communication with each other and may perform embodiments of the functions described with reference to FIGS. 1 through 6. In some cases, reference component 730, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). Word line 720 may be in electronic communication with memory controller 715 and a selection component of ferroelectric memory cell 710. Plate line 725 may be in electronic communication with memory controller 715 and a plate of the ferroelectric capacitor of ferroelectric memory cell 710. Sense component 735 may be in electronic communication with memory controller 715, digit line 740, and latch 745. Reference component 730 may be in electronic communication with memory controller 715. These components may also be in electronic communication with other components, both inside and outside of memory array 705, in addition to components not listed above, via other components, connections, or busses.

Memory controller 715 may be configured to activate word line 720, plate line 725, or digit line 740 by applying voltages to those various nodes. For example, biasing component 750 may be configured to apply a voltage to operate memory cell 710 to read or write memory cell 710 as described above. In some cases, memory controller 715 may include a row decoder, column decoder, or both, as described with reference to FIG. 1. This may enable memory controller 715 to access one or more memory cells 710. Biasing component 750 may also provide voltage potentials to reference component 730 in order to generate a reference signal for sense component 735. Additionally, biasing component 750 may provide voltage potentials for the operation of sense component 735.

In some cases, memory controller 715 may perform its operations using timing component 755. For example, timing component 755 may control the timing of the various word line selections or plate biasing, including timing for switching and voltage application to perform the memory functions, such as reading and writing, discussed herein. In some cases, timing component 755 may control the operations of biasing component 750.

Reference component 730 may include various components to generate a reference signal for sense component 735. Reference component 730 may include circuitry configured to produce a reference signal. In some cases, reference component 730 may be implemented using other ferroelectric memory cells 710. Sense component 735 may compare a signal from memory cell 710 (through digit line 740) with a reference signal from reference component 730. Upon determining the logic state, the sense component may then store the output in latch 745, where it may be used in accordance with the operations of an electronic device that memory array 705 is a part. Sense component 735 may include a sense amplifier in electronic communication with the latch and the ferroelectric memory cell.

Memory controller 715 may be an example of embodiments of the memory array 915 described with reference to FIG. 9.

Memory controller 715 and/or at least some of its various sub-components may be implemented in hardware, software executed by a processor, firmware, or any combination thereof. If implemented in software executed by a processor, the functions of the memory controller 715 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 715 and/or at least some of its various sub-components may be physically located at various positions, including being distributed such that portions of functions are implemented at different physical locations by one or more physical devices. In some examples, memory controller 715 and/or at least some of its various sub-components may be a separate and distinct component in accordance with various embodiments of the present disclosure. In other examples, memory controller 715 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 715 may activate a first switching component coupled between a second voltage source and a first capacitor and a second capacitor, apply a reference voltage to a sense component after the first switching component is activated, where the sense component is coupled to the first capacitor and the second capacitor, deactivate the first switching component after the reference voltage is applied to the sense component, and measure a voltage offset across both the first capacitor and the second capacitor.

Figure 8:
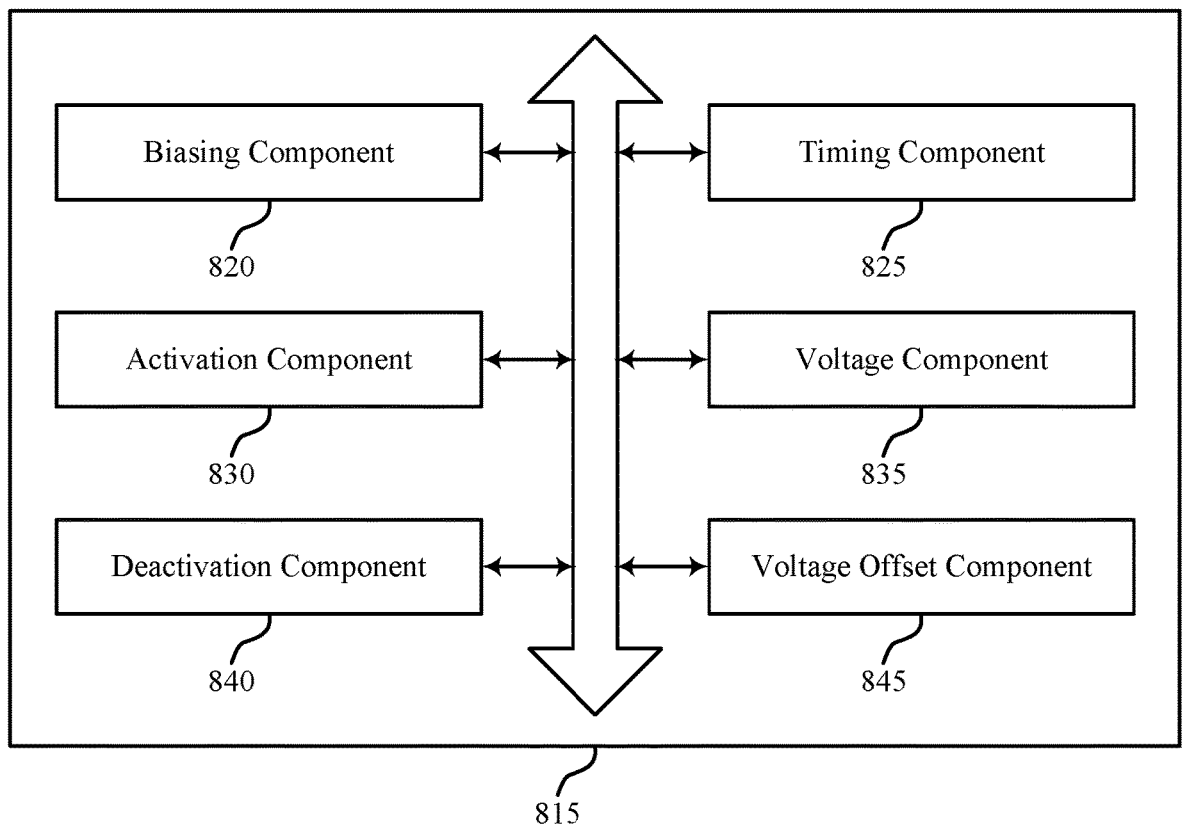

FIG. 8 shows a block diagram 800 of a memory array 815 that supports offset cancellation for latching in memory device in accordance with embodiments of the present disclosure. The memory array 815 may be an example of embodiments of a memory array 915 described with reference to FIGS. 7 and 9. The memory array 815 may include biasing component 820, timing component 825, activation component 830, voltage component 835, deactivation component 840, and voltage offset component 845. Each of these modules may communicate, directly or indirectly, with one another (e.g., via one or more buses).

Activation component 830 may activate a first switching component coupled between a second voltage source and a first capacitor and a second capacitor. In some cases, activation component 830 may initiate a sensing operation after the first switching component is activated. Activation component 830 may also activate a second switching component in electronic communication with a ferroelectric memory array and generate a first signal across a first transistor in response to activating the second switching component. In some cases, activation component 830 may activate a third switching component in electronic communication with a first reference voltage component and the sense component and generate a second signal across a second transistor in response to activating the third switching component. In some cases, activation component 830 may activate a fourth switching component and a fifth switching component after activating the first switching component, where the fourth switching component is coupled to the first capacitor via a first node and the fifth switching component is coupled to the second capacitor via a second node. In some examples, activation component 830 may activate a sixth switching component after activating the fourth switching component and the fifth switching component, where the sixth switching component is coupled to a first transistor and a second transistor in the sense component.

Voltage component 835 may apply a reference voltage to a sense component after the first switching component is activated, where the sense component is coupled to the first capacitor and the second capacitor. In some cases, voltage component 835 may measure a first voltage at a first node that is depending on a first threshold voltage of a first transistor in the sense component, where the first node connects the first capacitor to the first transistor in the sense component, and where measuring the voltage offset across both the first capacitor and the second capacitor based on measuring the first voltage. In some cases, voltage component 835 may measure a second voltage at a second node that is dependent on a second threshold voltage of a second transistor, where the second node connects the second capacitor to the second transistor in the sense component, and where measuring the voltage offset across both the first capacitor and the second capacitor is based on measuring the second voltage.

Deactivation component 840 may deactivate the first switching component after the reference voltage is applied to the sense component. In some cases, deactivation component 840 may deactivate the second switching component in electronic communication with the ferroelectric memory array and the sense component after the first signal is generated across the first transistor. In some cases, deactivation component 840 may deactivate the third switching component in electronic communication with the first reference voltage component and the sense component after the second signal is generated across the second transistor.

Voltage offset component 845 may measure a voltage offset across both the first capacitor and the second capacitor and read a logic state from a memory cell in electronic communication with the first capacitor and the second capacitor based on measuring the voltage offset.

Figure 9:
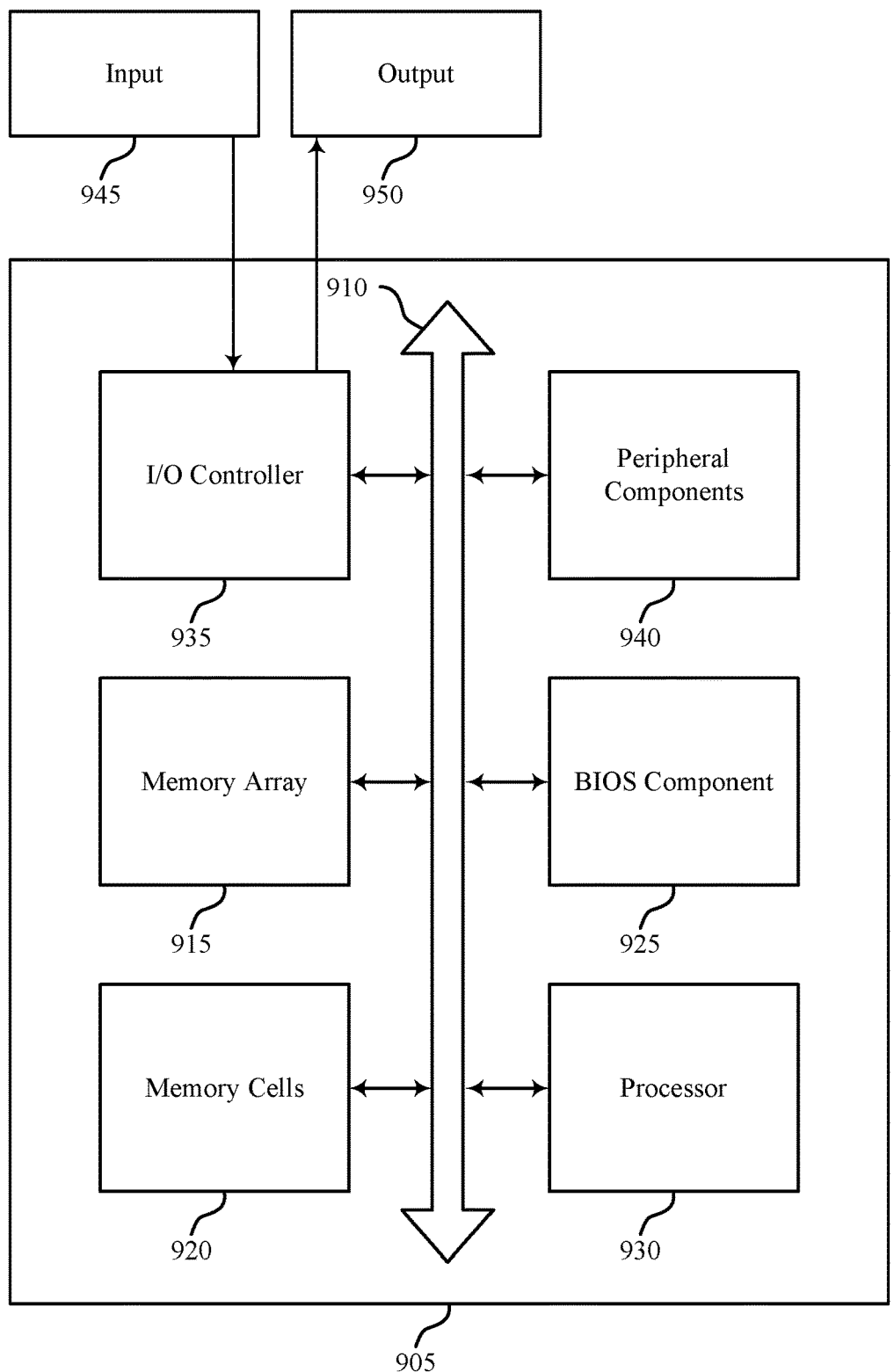
FIG. 9 shows a diagram of a system including a device that supports offset cancellation in a memory device in accordance with embodiments of the present disclosure.

FIG. 9 shows a diagram of a system 900 including a device 905 that supports offset cancellation for latching in memory device in accordance with embodiments of the present disclosure. Device 905 may be an example of or include the components of memory array 100 as described above, e.g., with reference to FIG. 1. Device 905 may include components for bi-directional voice and data communications including components for transmitting and receiving communications, including memory array 915, memory cells 920, basic input/output system (BIOS) component 925, processor 930, I/O controller 935, and peripheral components 940. These components may be in electronic communication via one or more busses (e.g., bus 910).

Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting offset cancellation for latching in memory device).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or embodiment of such a device.

Figure 10:
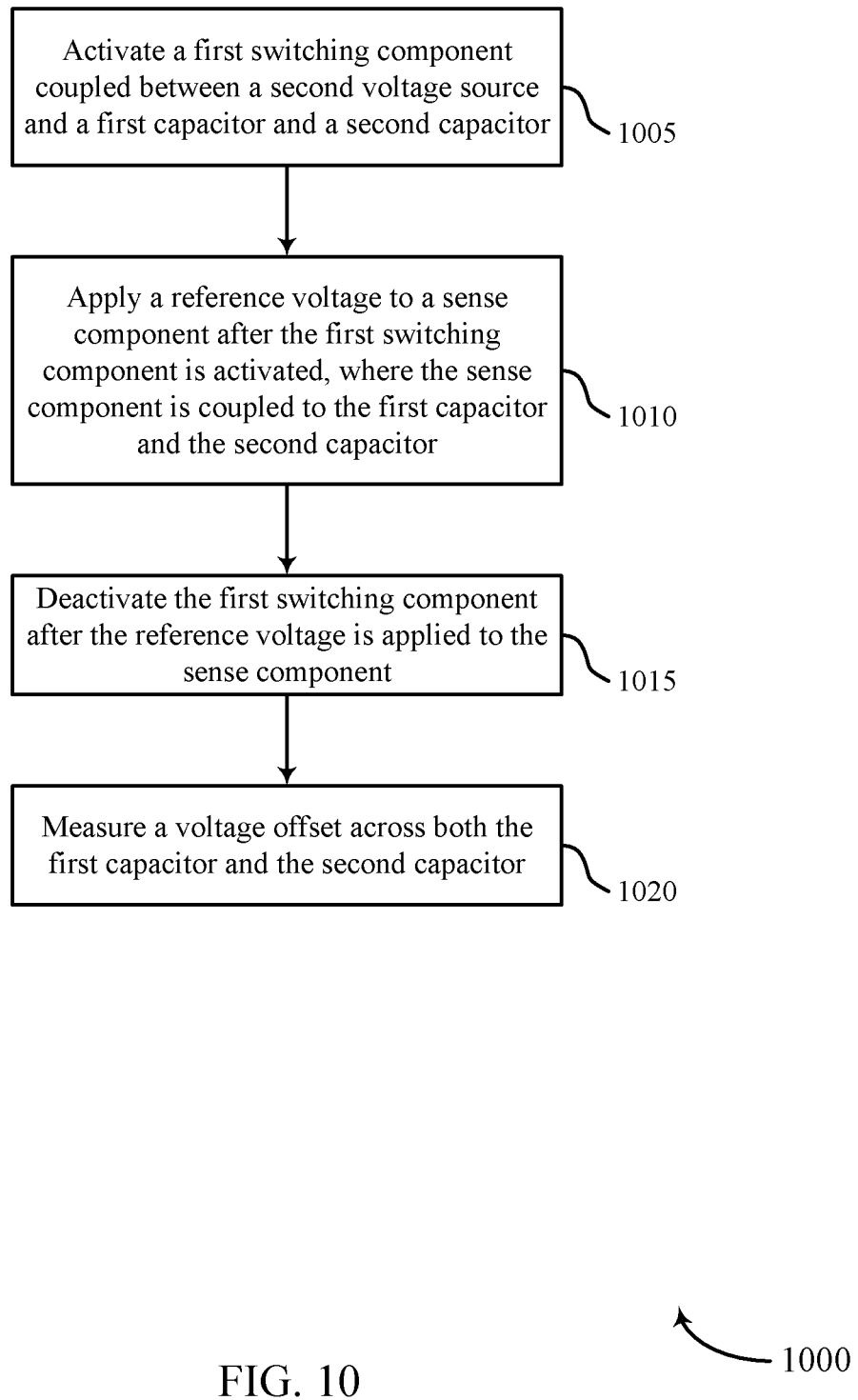
FIG. 10 shows a flowchart illustrating a method for offset cancellation in a memory device in accordance with embodiments of the present disclosure.

FIG. 10 shows a flowchart illustrating a method 1000 for offset cancellation for latching in memory device in accordance with embodiments of the present disclosure. The operations of method 1000 may be implemented by a memory array 100 or its components as described herein. For example, the operations of method 1000 may be performed by a memory array as described with reference to FIGS. 7 through 9. In some examples, a memory array 100 may execute a set of codes to control the functional elements of the device to perform the functions described below. Additionally or alternatively, the memory array 100 may perform embodiments of the functions described below using special-purpose hardware.

At block 1005 the memory array 100 may activate a first switching component coupled between a second voltage source and a first capacitor and a second capacitor. The operations of block 1005 may be performed according to the methods described with reference to FIGS. 4 through 6. In certain examples, embodiments of the operations of block 1005 may be performed by an activation component as described with reference to FIGS. 7 through 9.

At block 1010 the memory array 100 may apply a reference voltage to a sense component after the first switching component is activated, wherein the sense component is coupled to the first capacitor and the second capacitor. The operations of block 1010 may be performed according to the methods described with reference to FIGS. 4 through 6. In certain examples, embodiments of the operations of block 1010 may be performed by a voltage component as described with reference to FIGS. 7 through 9.

At block 1015 the memory array 100 may deactivate the first switching component after the reference voltage is applied to the sense component. The operations of block 1015 may be performed according to the methods described with reference to FIGS. 4 through 6. In certain examples, embodiments of the operations of block 1015 may be performed by a deactivation component as described with reference to FIGS. 7 through 9.

At block 1020 the memory array 100 may measure a voltage offset across both the first capacitor and the second capacitor. The operations of block 1020 may be performed according to the methods described with reference to FIGS. 4 through 6. In certain examples, embodiments of the operations of block 1020 may be performed by a voltage offset component as described with reference to FIGS. 7 through 9.

It should be noted that the methods described above describe possible implementations, and that the operations and the steps may be rearranged or otherwise modified and that other implementations are possible. Furthermore, embodiments from two or more of the methods may be combined.

In one embodiment, a memory array may include a sense component in electronic communication with a memory array, and a first voltage source, wherein the sense component comprises a first transistor and a second transistor, a first capacitor coupled to the first transistor via a first node, a second capacitor coupled to the second transistor via a second node, and a first switching component coupled between a second voltage source and the first capacitor and the second capacitor via a third node.

In one embodiment, a system may include a sense component in electronic communication with a memory array, and a first voltage source, wherein the sense component comprises a first transistor and a second transistor, a first capacitor coupled to the first transistor via a first node, a second capacitor coupled to the second transistor via a second node, and a first switching component coupled between a second voltage source and the first capacitor and the second capacitor via a third node.

A method of for operating a memory array is described. The method may include forming a sense component in electronic communication with a memory array, and a first voltage source, wherein the sense component comprises a first transistor and a second transistor, forming a first capacitor coupled to the first transistor via a first node, forming a second capacitor coupled to the second transistor via a second node, and forming a first switching component coupled between a second voltage source and the first capacitor and the second capacitor via a third node.

In some examples of the memory array described above, the first capacitor may be positioned between the first node and the third node and the second capacitor may be positioned between the second node and the third node.

Some examples of the memory array described above may also include a first reference voltage component coupled to the first transistor of the sense component, wherein the first reference voltage component comprises a second switching component. Some examples of the memory array described above may also include a second reference voltage component coupled to the second transistor of the sense component, wherein the second reference voltage component comprises a third switching component.

Some examples of the memory array described above may also include a fourth switching component coupled to the first capacitor via the first node, wherein the fourth switching component comprises a nMOS transistor. Some examples of the memory array described above may also include a fifth switching component coupled to the second capacitor via the second node, wherein the fifth switching component comprises a nMOS transistor.

Some examples of the memory array described above may also include a sixth switching component coupled to the first transistor and the second transistor, wherein the sixth switching component comprises a pMOS transistor.

A method of for operating a memory array is described. The method may include activating a first switching component coupled between a second voltage source and a first capacitor and a second capacitor, applying a reference voltage to a sense component after the first switching component is activated, wherein the sense component is coupled to the first capacitor and the second capacitor, deactivating the first switching component after the reference voltage is applied to the sense component, and measuring a voltage offset across both the first capacitor and the second capacitor.

An apparatus for operating a memory array is described. The apparatus may include means for activating a first switching component coupled between a second voltage source and a first capacitor and a second capacitor, means for applying a reference voltage to a sense component after the first switching component is activated, wherein the sense component is coupled to the first capacitor and the second capacitor, means for deactivating the first switching component after the reference voltage is applied to the sense component, and means for measuring a voltage offset across both the first capacitor and the second capacitor.

Another apparatus for operating a memory array is described. The apparatus may include a memory cell and a memory controller in electronic communication with the memory cell, wherein the memory cell is operable to activate a first switching component coupled between a second voltage source and a first capacitor and a second capacitor, apply a reference voltage to a sense component after the first switching component is activated, wherein the sense component is coupled to the first capacitor and the second capacitor, deactivate the first switching component after the reference voltage is applied to the sense component, and measure a voltage offset across both the first capacitor and the second capacitor.

Some examples of the method and apparatus described above may further include processes, features, means, or instructions for reading a logic state from a memory cell in electronic communication with the first capacitor and the second capacitor based at least in part on measuring the voltage offset.

Some examples of the method and apparatus described above may further include processes, features, means, or instructions for initiating a sensing operation after the first switching component may be activated.

Some examples of the method and apparatus described above may further include processes, features, means, or instructions for activating a second switching component in electronic communication with a ferroelectric memory array; and generating a first signal across a first transistor in response to activating the second switching component.

Some examples of the method and apparatus described above may further include processes, features, means, or instructions for deactivating the second switching component in electronic communication with the ferroelectric memory array and the sense component after the first signal may be generated across the first transistor.

Some examples of the method and apparatus described above may further include processes, features, means, or instructions for activating a third switching component in electronic communication with a first reference voltage component and the sense component; generating a second signal across a second transistor in response to activating the third switching component.

Some examples of the method and apparatus described above may further include processes, features, means, or instructions for deactivating the third switching component in electronic communication with the first reference voltage component and the sense component after the second signal may be generated across the second transistor.

Some examples of the method and apparatus described above may further include processes, features, means, or instructions for activating a fourth switching component and a fifth switching component after activating the first switching component, wherein the fourth switching component may be coupled to the first capacitor via a first node and the fifth switching component may be coupled to the second capacitor via a second node.

Some examples of the method and apparatus described above may further include processes, features, means, or instructions for activating a sixth switching component after activating the fourth switching component and the fifth switching component, wherein the sixth switching component may be coupled to a first transistor and a second transistor in the sense component.

Some examples of the method and apparatus described above may further include processes, features, means, or instructions for measuring a first voltage at a first node that may be proportional to a first threshold voltage of a first transistor in the sense component, wherein the first node connects the first capacitor to the first transistor in the sense component, and wherein measuring the voltage offset across both the first capacitor and the second capacitor may be based at least in part on measuring the first voltage.

Some examples of the method and apparatus described above may further include processes, features, means, or instructions for measuring a second voltage at a second node that may be proportional to a second threshold voltage of a second transistor, wherein the second node connects the second capacitor to the second transistor in the sense component, and wherein measuring the voltage offset across both the first capacitor and the second capacitor may be based at least in part on measuring the second voltage.

Some examples of the method and apparatus described above may further include processes, features, means, or instructions for reducing a voltage disparity between the first transistor and the second transistor of the sense component by coupling the first capacitor and the second capacitor to the sense component Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components.

Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A device for operating a memory array, comprising:
a sense component in electronic communication with the memory array, the sense component comprising one or more transistors;
a first switching component coupled to at least one of the one or more transistors; and
a second switching component coupled to the memory array and the sense component, wherein the second switching component is configured to couple the memory array to the sense component based at least in part on a supply signal applied to a gate of the second switching component.

2. The device of claim 1, wherein:
the first switching component comprises a pMOS transistor.

3. The device of claim 1, wherein:
the one or more transistors of the sense component comprise one or more pMOS transistors and one or more nMOS transistors.

4. The device of claim 3, wherein:
at least one pMOS transistor of the one or more pMOS transistors and at least one nMOS transistor of the one or more nMOS transistors comprise a cross-coupled pMOS and nMOS transistor pair.

5. The device of claim 1, further comprising:
a first capacitor coupled to a first transistor of the one or more transistors via a first node; and
a second capacitor coupled to a second transistor of the one or more transistors via a second node.

6. The device of claim 5, further comprising:
a third switching component coupled to a voltage source and the first capacitor and the second capacitor via a third node, wherein the voltage source is configured to supply either a positive voltage source or a virtual ground reference source based at least in part on an operational state of the third switching component.

7. The device of claim 6, wherein the first node and the second node are configured to store a charge associated with the memory array based at least in part on a capacitance of a conductive line coupled to the first transistor and the second transistor, or at the third node based at least in part on a capacitance of a conductive line coupled to the third switching component and the sense component.

8. The device of claim 5, wherein a voltage associated with the first node is based at least in part on a threshold voltage of the first transistor and a voltage associated with the second node is based at least in part on a threshold voltage of the second transistor.

9. A method for operating a memory array, comprising:
activating a first switching component that is coupled to a first reference voltage source and a sense component, the sense component coupled to a first capacitor via a first node and a second capacitor via a second node;
activating a second switching component that is coupled to a second reference voltage source and the sense component;
applying a first reference voltage associated with the first reference voltage source to the sense component after activating the first switching component;
applying a second reference voltage associated with the second reference voltage source to the sense component after activating the second switching component; and
measuring a voltage offset between the first capacitor and the second capacitor at the sense component.

10. The method of claim 9, further comprising:
activating a third switching component the third switching component being coupled to the first capacitor, the second capacitor, and a voltage source;
applying a voltage associated with the voltage source to a third node after activating the third switching component, the third node being coupled to the first capacitor and the second capacitor; and
deactivating the third switching component based at least in part on applying the voltage.

11. The method of claim 10, further comprising:
charging the first node and the second node to a reference voltage after activating the first switching component and the second switching component, and wherein the first node and the second node are charged to a voltage level between a pre-charge voltage and the reference voltage after the third switching component is deactivated.

12. The method of claim 9, further comprising:
activating a third switching component that is coupled to the first capacitor, the second capacitor, and a first voltage source;
activating a fourth switching component that is coupled to the first node and a second voltage source; and
applying a pre-charge voltage to the first node after activating the third switching component and the fourth switching component.

13. The method of claim 12, further comprising:
activating a fifth switching component that is coupled to the second node and a third voltage source; and
applying a pre-charge voltage to the second node after the fifth switching component is activated.

14. The method of claim 13, wherein the first voltage source and the third voltage source are ground voltages.

15. The method of claim 9, further comprising:
activating a sixth switching component that is coupled with the sense component and the memory array; and
generating a signal from the memory array to the sense component after activating the sixth switching component.

16. The method of claim 15, further comprising:
deactivating the second switching component and the sixth switching component, wherein the second reference voltage source and the memory array are isolated from the sense component based at least in part on the deactivating.

17. The method of claim 9, further comprising:
activating a third switching component, the third switching component being coupled to a first voltage source and being coupled to the first capacitor and the second capacitor via a third node;
activating a fourth switching component that is coupled to the first node;
activating a fifth switching component that is coupled to the second node; and
activating the fourth switching component and the fifth switching component after activating the third switching component.

18. The method of claim 9, further comprising:
activating a seventh switching component that is coupled to the sense component; and
storing data in the sense component in a latch after activating the seventh switching component.

19. An apparatus comprising:
a ferroelectric memory cell in a memory array;
a first switching component and a second switching component; and
a memory controller in electronic communication with the ferroelectric memory cell, the memory controller operable to:
initiate activation of the first switching component that is coupled to a first reference voltage source and a sense component, wherein the sense component is coupled to a first capacitor via a first node and a second capacitor via a second node;
initiate activation of the second switching component the second switching component being coupled to a second reference voltage source and the sense component;
initiate application of a first reference voltage associated with the first reference voltage source to the sense component after the first switching component is activated;
initiate application of a second reference voltage associated with the second reference voltage source to the sense component after the second switching component is activated; and
initiate measurement of a voltage offset between the first capacitor and the second capacitor at the sense component.

20. The apparatus of claim 19, further comprising:
a third switching component that is coupled to the first capacitor, the second capacitor, and a voltage source
wherein the memory controller is operable to:
initiate activation of the third switching component;
initiate application of a voltage associated with the voltage source to a third node after the third switching component is activated, the third node being coupled to the first capacitor and the second capacitor; and
initiate deactivation of the third switching component based at least in part on the application of the voltage.

* * * * *